US006463184B1

(12) United States Patent
Gould et al.

(10) Patent No.: US 6,463,184 B1
(45) Date of Patent: Oct. 8, 2002

(54) METHOD AND APPARATUS FOR OVERLAY MEASUREMENT

(75) Inventors: Chris Gould, Stanfordville; K. Paul Muller, Wappingers Falls; V. C. Jai Prakash, Beacon; Robert van den Berg, Hopewell Junction, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/335,091

(22) Filed: Jun. 17, 1999

(51) Int. Cl.[7] .................................................. G06K 9/36

(52) U.S. Cl. ......................... 382/289; 382/151; 382/295

(58) Field of Search ................................. 382/289, 276, 382/280, 284, 287, 181, 144, 147, 294, 295, 302, 151, 141; 356/399, 401; 438/400, 401; 700/121

(56) References Cited

U.S. PATENT DOCUMENTS 4,929,083 A 5/1990 Brunner ...................... 356/400
5,151,750 A * 9/1992 Magome et al. ............ 356/401
5,438,413 A * 8/1995 Mazor et al. ............... 356/363
6,023,338 A * 2/2000 Bareket ....................... 356/401
6,061,606 A * 5/2000 Ross .......................... 700/121
6,088,103 A * 7/2000 Everett et al. .............. 356/355
6,150,231 A * 11/2000 Muller et al. ............... 438/401

* cited by examiner

*Primary Examiner*—Leo Boudreau
*Assistant Examiner*—Kanji Patel
(74) *Attorney, Agent, or Firm*—Schmeiser, Olsen & Watts LLP

(57) ABSTRACT

A process for measuring the alignment of different layers on a semiconductor wafer (33) includes forming repetitive alignment marks (14, 24) having substantially the same period on the different layers on the wafer (33). The images of the overlay alignment marks (14, 24) are converted from space domain to frequency domain through Fourier transformations. The alignment measurements are performed by calculating the phase difference between the images corresponding to the repetitive patterns (14, 24) on different layers.

15 Claims, 3 Drawing Sheets

PHASE COMPARATOR 48
42
FAST FOURIER TRANSFORMER 45
DIGITIZER 43
41
36
33
32
30

METHOD AND APPARATUS FOR OVERLAY MEASUREMENT

FIELD OF THE INVENTION

The present invention relates, in general, to optical measurements and, more particularly, to pattern overlay measurements.

BACKGROUND OF THE INVENTION

State of the art semiconductor devices and integrated circuits include multi-layer structures having dimensions less then one micrometer. Proper alignment of different layers is essential for proper performance of the fabricated semiconductor devices and circuits. Overlay measurements are routinely performed to verify the proper alignment. Lack of proper alignment typically results in overlay measurement of specification and trigger rework.

Overlay measurements optically measure the relative positions of the overlay marks on different layers of a structure on the semiconductor wafer. More particularly, a rectangular overlay mark is formed on each layer of the structure. When two rectangular overlay marks on two consecutive layers are centered with respect to each other, the two layers are properly aligned to each other. The rectangular overlay marks are also referred to as box-in-box patterns. In terms of width, length, pattern density, etc., the box-in-box overlay patterns differ significantly from the device related array patterns on the wafer. Furthermore, the fabrication processes, e.g., lithography, etch, strip, fill, etc., are optimized for the best performance of the device related array patterns. They often result in reduced overlay mark integrity. These factors adversely affect the overlay measurement capabilities. In addition, optically measuring the edge positions of a box-in-box pattern having dimensions less than one micrometer is difficult.

Accordingly, it would be advantageous to have a method and an apparatus for an overlay measurement that are easy to implement in submicron ranges. It is desirable for the capability of the overlay measurement not to be adversely affected by the semiconductor device fabrication processes. It would be of further advantage for the apparatus to be simple and cost efficient.

SUMMARY OF THE INVENTION

Generally, the present invention provides a method and an apparatus for overlay measurement. In accordance with the present invention, repetitive patterns are formed on different levels or layers to be aligned with each other. The patterns serve as overlay alignment marks. Preferably, the repetitive overlay marks on different levels have periods substantially equal to each other. Further, they are preferably substantially equal to the period of the product pattern. An image processor transforms the images of the repetitive overlay marks into phase images. The overlay measurement is performed by analyzing the phase difference between the repetitive overlay marks on different levels.

BRIEF DESCRIPTION OF THE DRAWINGS

It should be noted that the figures are not necessarily drawn to scale and that elements having similar functions are labeled using the same reference numerals in the figures.

DETAILED DESCRIPTION OF THE PREFERRED EMBODIMENTS

Preferred embodiments of the present invention are described herein below using overlay measurement of structures formed on a semiconductor wafer as an example. It should be understood the application of the present invention is not limited to semiconductor device fabrication processes. It is also applicable in the alignment measurement of multiple layer design patterns.

Figure 1:
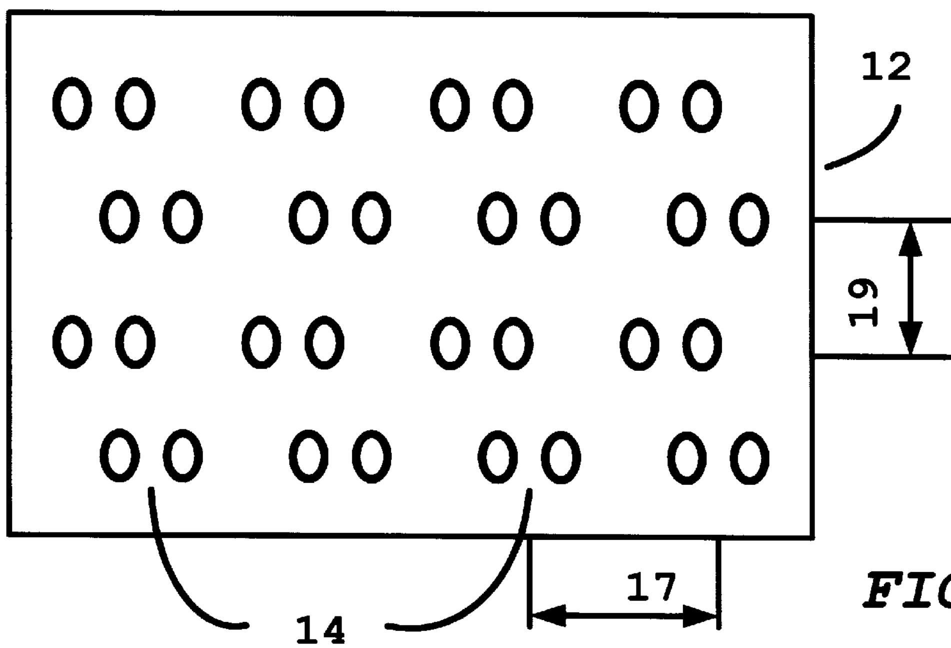
FIG. 1 schematically illustrates an overlay alignment mark in accordance with the present invention.

FIG. 1 is a schematic diagram showing an overlay alignment mark 12 in accordance with the present invention. By way of example, mark 12 is formed on a semiconductor wafer (not shown). Mark 12 is an array of repetitive patterns 14. Array 12 of patterns 14 is arranged in rows. Within each row, a distance between two adjacent patterns 14 is referred to as a pitch 17 of array 12. A distance between two adjacent rows of patterns 14 is referred as a depth 19 of array 12. Pitch 17 and depth 19 of array 12 characterize a period of array 12. Array 12 of patterns 14 can be a portion of a larger array of repetitive patterns.

Figure 2:
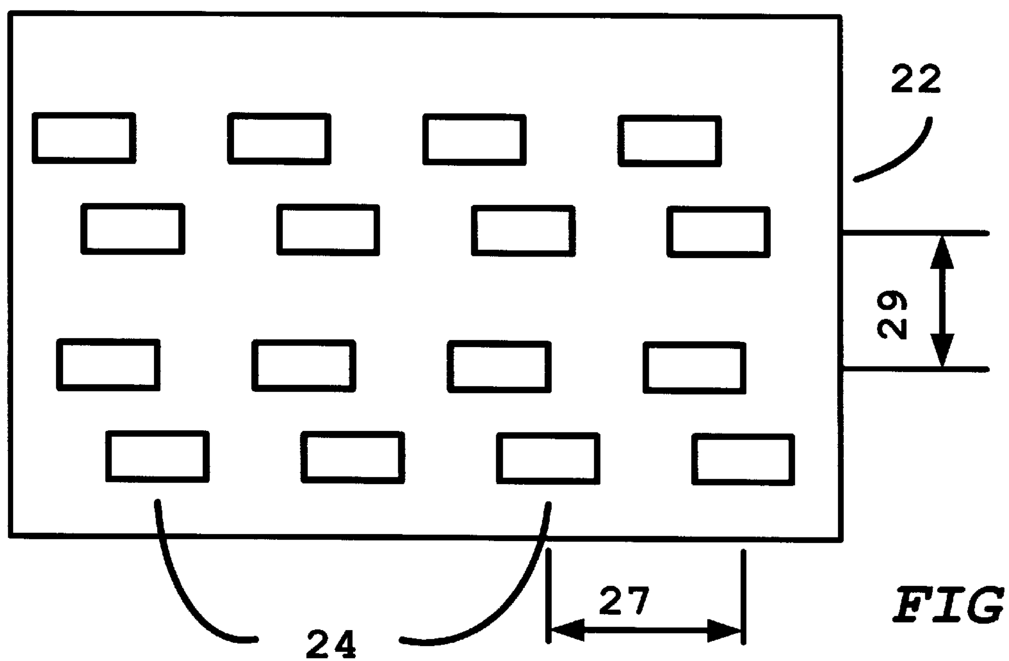
FIG. 2 schematically illustrates another overlay alignment mark in accordance with the present invention.

FIG. 2 is a schematic diagram showing an overlay alignment mark 22 in accordance with the present invention. By way of example, mark 22 is formed on the semiconductor wafer (not shown) as mark 12 shown in FIG. 1 or formed on a mask (not shown). Like mark 12, mark 22 is an array of repetitive patterns 24. Array 22 of patterns 24 is arranged in rows. Within each row, a distance between two adjacent patterns 24 is referred to as a pitch 27 of array 22. A distance between two adjacent rows of patterns 24 is referred as a depth 29 of array 22. Pitch 27 and depth 29 of array 22 characterize a period of array 22. Array 22 of patterns 24 can be a portion of a larger array of repetitive patterns.

Preferably, the periods of arrays 12 and 22 are substantially equal to each other. In other words, pitch 17 of array 12 and pitch 27 of array 22 are preferably substantially equal to each other, and depth 19 of array 12 and depth 29 of array 22 preferably substantially equal to each other. In order to maintain the integrity of arrays 12 and 22 during the optimization of the fabrication processes, the periods of arrays 12 and 22 are preferably substantially the same as the periods of the device related array patterns on the semiconductor wafer. Pitches 17 and 27 and depths 19 and 29 are typically in the ranges from the order of tens of micrometers to the order of hundreds of micrometers.

As shown in FIG. 1, the positions of patterns 14 in two adjacent rows are displaced from each other. The displacement is in a direction substantially parallel to the rows of patterns 14 and has a magnitude approximately equal to one half of pitch 17. Likewise, FIG. 2 shows that there is a displacement in the positions of patterns 24 in two adjacent rows substantially parallel to the rows of patterns 24. It should be understood that these pattern arrangements are not intended as limitations of the present invention. In accordance with the present invention, array 12 of patterns 14 and array 22 of patterns 24 can have any repetitive arrangement. For example, the displacements in the positions of patterns 14 between two adjacent rows in arrays 12 can have any value, e.g., one quarter of pitch 17, one third of pitch 17, three fifths of pitch 17, etc. Furthermore, patterns 14 in different rows in array 12 can be aligned with each other. Likewise, patterns 24 in different rows in array 22 can be aligned with each other or displaced from each other by any value.

Preferably, arrays 12 and 22 are formed outside an active chip area (not shown) of the semiconductor wafer. Arrays 12 and 22 are formed on different levels or different layers on the semiconductor wafer. For example, array 12 of patterns 14 can be formed in a deep trench level and array 22 of patterns 24 can be formed in an active area level above the deep trench level. The vertical distance between the two levels can range from less than one micrometer to approximately ten micrometers. In one embodiment, arrays 12 and 22 are formed in such a way that, when viewed in a direction substantially perpendicular to a major surface of the semiconductor wafer, arrays 12 and 22 are side by side adjacent to each other. In an alternative embodiment, array 22 is formed on top of array 12 so that, when viewed from a direction substantially perpendicular to the major surface of the semiconductor wafer, array 22 of patterns 24 is superposed on array 12 of patterns 14.

Figure 3:
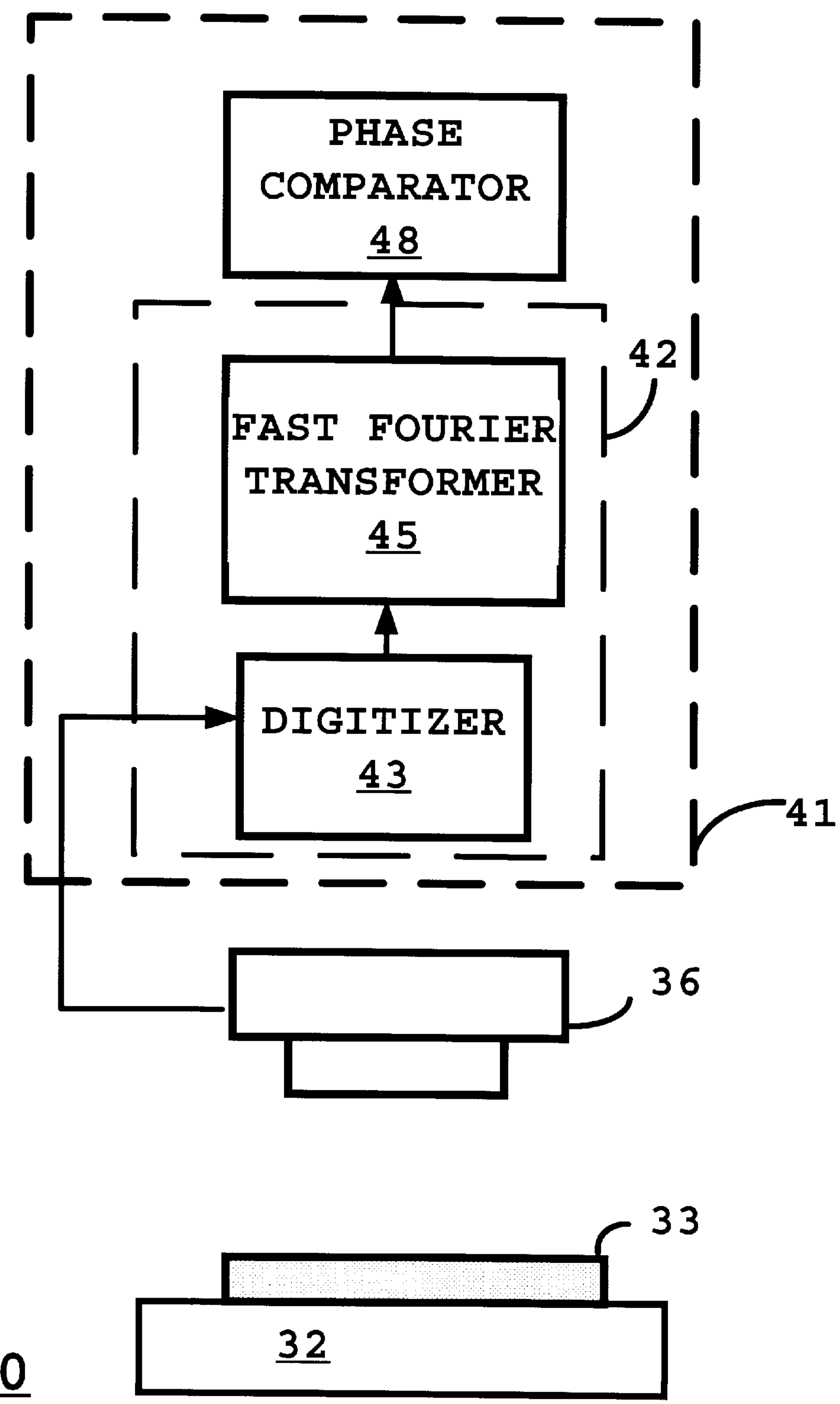
FIG. 3 is a block diagram of an apparatus for overlay measurement in accordance with the present invention.

FIG. 3 is a block diagram schematically illustrating an apparatus 30 for overlay measurement in accordance with the present invention. Apparatus 30 includes a wafer platform 32, a video camera 36, and a measurement circuit 41. During an overlay measurement process, a semiconductor wafer 33 is placed on wafer platform 32. Preferably, platform 32 has a chuck system such as, for example, a vacuum system (not shown) to hold semiconductor wafer 33 during the measuring process. Semiconductor wafer 33 has at least two arrays of alignment patterns, e.g., array 12 of patterns 14 shown in FIG. 1 and array 22 of pattern 24 shown in FIG. 2, formed in different levels or layers thereon. Camera 36 takes the pictures of the arrays of overlay alignment patterns, e.g., array 12 of patterns 14 and array 22 of patterns 24, on wafer 33. Measurement circuit 41 performs the overlay measurement by processing and comparing the pictures of the array patterns.

Measurement circuit 41 includes an image processor 42 and a phase comparator 48. Image processor 42 converts the pictures of the array patterns in camera 36 into phase images. Phase comparator 48 is coupled to image processor 42. In operation, phase comparator 48 calculates the phase difference between the phase images of the array patterns in different levels on semiconductor wafer 33, thereby performing the overlay measurement.

More particularly, image processor 42 includes a digitizer 43 and a signal processor 45. Digitizer 43 has an input connected to camera 36 and an output. Digitizer 43 digitizers the pictures in camera 36 to generate digitized image signals at its output. By way of example, signal processor 45 is a fast Fourier transforming circuit, which is sometimes also referred to as a Fast Fourier transformer or simply a Fourier transformer. Fourier transformer 45 has an input connected to the output of digitizer 43 and an output connected to phase comparator 48. During an overlay measurement process, Fourier transformer 45 performs fast Fourier transformation on digitized image signals at the output of digitizer 43 and generates a geometric spectrum or a spectrum image from each digitized image. The geometric spectra are transmitted to phase comparator 48.

In one of the above mentioned embodiments, wafer 33 has array 12 of repetitive patterns 14 (shown in FIG. 1) and array 22 of repetitive patterns 24 (shown in FIG. 2) formed adjacent to each other when viewed in a direction substantially perpendicular to wafer 33. Camera 36 takes two pictures. A first picture contains an image of array 12 of patterns 14. A second picture contains an image of array 22 of patterns 24. Digitizer 43 digitizes the first picture to generate a first digitized image. Fourier transformer 45 performs a Fourier transformation on the first digitized image and generates a first geometric spectrum or a first phase image. In other words, Fourier transformer 45 transforms the image of array 12 of patterns 14 from a space domain into a frequency domain. Digitizer 43 also digitizes the second picture to generate a second digitized image. Fourier transformer 45 transforms the second digitized image into a second geometric spectrum of a second phase image. Phase comparator 48 calculates the phase difference between the first and second geometric spectra, thereby measuring the alignment between the two levels on wafer 33 which contain array 12 of patterns 14 and array 22 of patterns 24. Alternatively, camera 36 takes one picture of wafer 33. A first portion of the picture contains an image of array 12 of patterns 14, and a second portion of the picture contains an image of array 22 of patterns 24. Digitizer 43 generates the first and second digitized images from the first and second portions, respectively, of the picture. Signal processor 45 converts the first and second digitized images into the first and second geometric spectra, respectively. Phase comparator 48 performs the alignment measurement by calculating the phase difference between the two geometric spectra.

In another of the above mentioned embodiments, wafer 33 has array 12 of repetitive patterns 14 (shown in FIG. 1) formed under array 22 of repetitive patterns 24 (shown in FIG. 2). Array 22 of repetitive patterns 24 is superposed on array 12 of repetitive patterns 14 when viewed in a direction substantially perpendicular to wafer 33. Camera 36 takes two pictures. A first picture is taken while focusing camera 36 on the level, e.g., the deep trench level, containing array 12 of patterns 14, and a second picture is taken while focusing camera 36 on the level, e.g., the active area level, containing array 22 of patterns 24. In this embodiment, camera 36 preferably has a sharp focus or a shallow depth of view. Consequently, the level that contains array 22 of patterns 24 is out of focus when the first picture is taken and the level that contains array 12 of patterns 14 is out of focus when the second picture is taken. Digitizer 43 digitizes the first and second pictures to generate first and second digitized images, respectively. Fourier transformer 45 transforms the first and second digitized images into first and second geometric spectra. Phase comparator 48 calculates the phase difference between the first and second geometric spectra, thereby measuring the overlay alignment between the two levels on wafer 33 which contain array 12 of patterns 14 and array 22 of patterns 24.

It should be understood that apparatus 30 and the overlay measurement process are not limited to those described herein before with reference to FIG. 3. In an alternative apparatus embodiment of the present invention, image processor 42 in apparatus 30 includes two signal processors coupled in parallel between digitizer 43 and phase comparator 48. Each signal processor is functionally similar to signal processor 45. During the overlay measurement process, one signal processor converts the first digitized image into the first phase image and another signal processor converts the second digitized image into the second phase image. In an alternative process embodiment of the present invention, the measurement process measures the overlay alignment between more than two levels on wafer 33. In such an embodiment, digitizer 43 generates more than two digitized images, one digitized image corresponding to each level on wafer 33. Signal processor 45 generates a phase image from each digitized image. Phase comparator 48 measures the overlay alignment between different levels by calculating the phase differences between the phase images corresponding to different levels on wafer 33.

Figure 4:
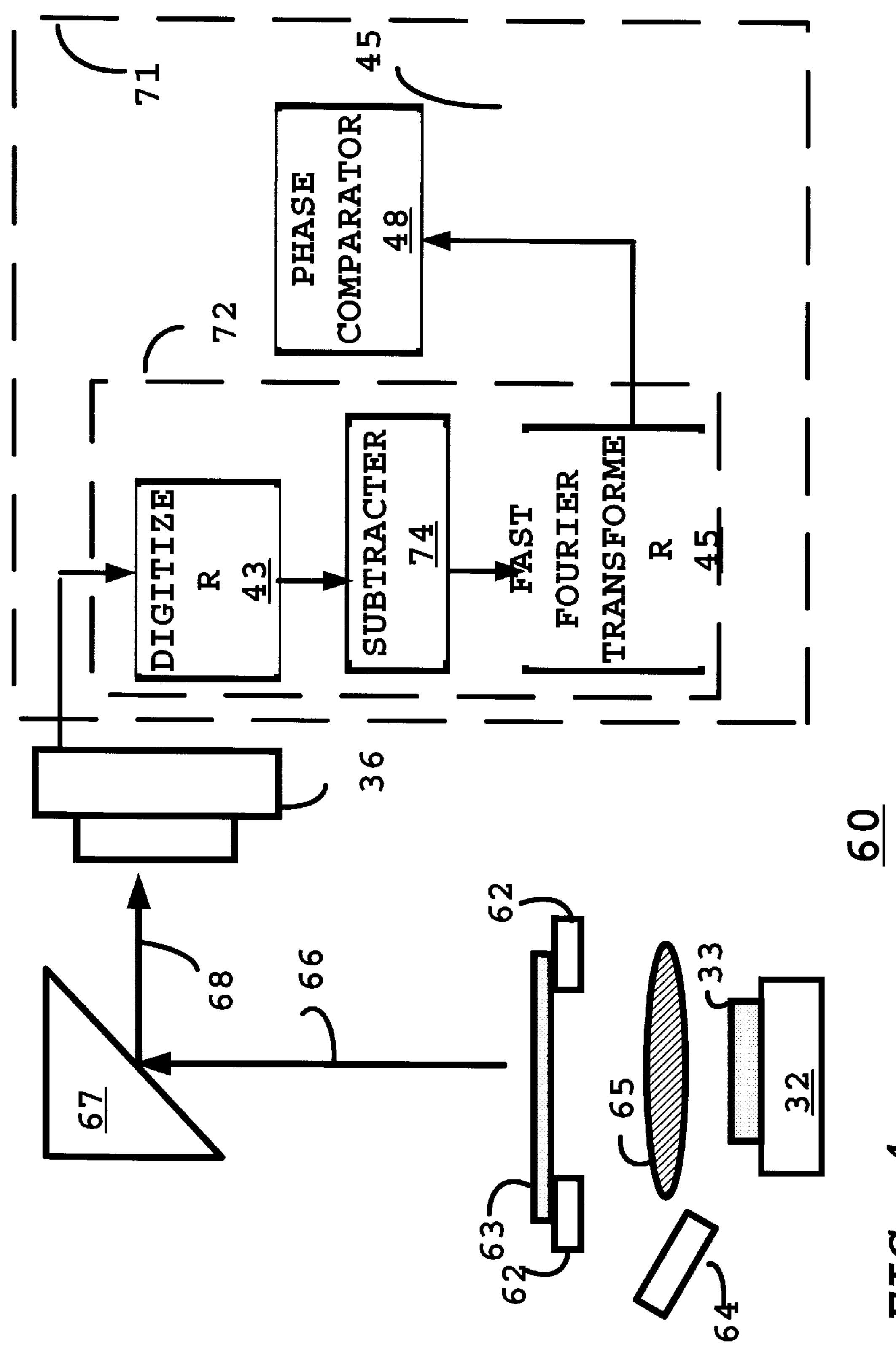
FIG. 4 is a block diagram of another apparatus for overlay measurement in accordance with the present invention.

FIG. 4 is a block diagram schematically illustrating an apparatus 60 for overlay measurement in accordance with the present invention. Like apparatus 30 described supra with reference to FIG. 3, apparatus 60 includes a wafer platform 32, a video camera 36, and a measurement circuit 71. In addition, apparatus 60 includes a mask stage 62, a light source 64, an optical lens 65, and a light deflector 67. Apparatus 60 is used for measuring an overlay alignment between a reticle or a mask, e.g., a mask 63 placed on mask stage 62, and a wafer, e.g., a semiconductor wafer 33 placed on wafer platforms 32. Wafer 33 has a pattern thereon. By way of example, the pattern on wafer 33 includes array 12 of repetitive patterns 14 shown in FIG. 1. Mask 63 has a pattern that is to be formed on a next level on semiconductor wafer 33 in a photolithography process. By way of example, the pattern on mask 63 includes array 22 of repetitive patterns 24 shown in FIG. 2.

Light source 64 is intermittently switched on to illuminate wafer 33 placed on platform 32 during the overlay measurement process. Optical lens 65 is a converging lens that forms an image of wafer 33 on mask 63 when wafer 33 is illuminated by light source 64. Preferably, the optical characteristics of lens 65 are substantially identical to a lens used for printing patterns on mask 63 onto wafer 33 in a photolithography process. By way of example, the lens projects a 4:1 reduced image of mask 63 on wafer 33 during the photolithography process, and lens 65 projects a 1:4 magnified image of wafer 33 on mask 63 when wafer 33 is illuminated during the overlay measurement process. Light deflector 67 deflects light from mask 63 into camera 36 as shown by light beams 66 and 68 in FIG. 4. Light deflector 67 can include a beam splitter, a prism, a mirror, or any combination thereof. It should be understood that light deflector 67 is optional in apparatus 60.

Measurement circuit 71 includes an image processor 72 and a phase comparator 48. Image processor 72 converts the images of the array patterns in camera 36 into phase images. Phase comparator 48 is coupled to image processor 72 and calculates the phase difference between the phase images, thereby performing the overlay measurement. Like image processor 42 shown in FIG. 3, image processor 72 includes a digitizer 43 and a signal processor such as, for example, fast Fourier transformer 45. In addition, image processor 72 also includes a digital subtracting circuit or a subtracter 74 coupled between digitizer 43 and fast Fourier transformer 45. An input of digitizer 43 is connected to video camera 36. Subtracter 74 has an input connected to an output of digitizer 43 and an output connected to an input of fast Fourier transformer 45. An output of fast Fourier transformer 45 is connected to phase comparator 48.

The overlay measurement process includes using camera 36 to take two pictures of mask 63. A first picture is taken with light source 64 off, so that wafer 33 is not illuminated. The first picture includes an image of array 22 of repetitive patterns 24 on mask 63. A second picture is taken with light source 64 switched on, so that wafer 33 is illuminated. The second picture includes an image of array 12 of repetitive patterns 14 superposed on array 22 of repetitive patterns 24. Digitizer 43 digitizes the first picture to generate a first digitized image, which contains data of repetitive patterns 24 on mask 63. Digitizer 43 also digitizes the second picture to generate a composite digitized image. The composite digitized image contains data of repetitive patterns 14 on wafer 33 superposed on repetitive patterns 24 on mask 63.

The first digitized image and composite digitized image are transmitted to subtracter 74 in signal processor 72. Subtracter 74 generates a second digitized image by subtracting the first digitized image from the composite digitized image. Thus, the second digitized image contains data of repetitive patterns 14 on wafer 33. Fourier transformer 45 performs a fast Fourier transformation on the first digitized image and generates a first geometric spectrum. Likewise, Fourier transformer 45 transforms the second digitized image into a second geometric spectrum. Phase comparator 48 calculates the phase difference between the first and second geometric spectra, thereby measuring the alignment between array 22 of repetitive patterns 24 on mask 63 and array 12 of repetitive patterns 14 on wafer 33.

By now it should be appreciated that a method and an apparatus for an overlay measurement have been provided. In accordance with the present invention, repetitive overlay alignment marks are formed on different levels or layers to be aligned with each other. An image processor transforms the images of the repetitive overlay marks into phase images. The phase difference between the repetitive overlay marks on different layers is calculated to measure the overlay alignment between the different levels. When applying the present invention to the overlay measurement process in semiconductor fabrication processes, the periods of the repetitive overlay marks are preferably determined in accordance with the periods of the device related patterns on the semiconductor wafer. Because the overlay marks and the device related patterns are both repetitive arrays patterns, optimizations of the device fabrication processes such as, for example, lithography, etch, strip, deposition, fill, etc., do not adversely affect the integrity of the overlay marks. The overlay marks can be formed in the same process as the device related array patterns and, therefore, can have substantially the same characteristics, e.g., width, length, density, as the device related array patterns. Therefore, the device fabrication processes and device scale down do not adversely affect the overlay measurement of the present invention. The phase analysis for the overlay measurement of the present invention is simple and accurate. It can be easily performed for microscopic patterns having dimensions in the nanometer range. The apparatus for performing the overlay measurement of the present invention is simple and can be constructed from conventional overlay measurement apparatuses by adding appropriate signal processing circuitry and software programs thereto. Therefore, it is simple and cost efficient.

What is claimed is:

1. A method for measuring an alignment between a first pattern and a second pattern, comprising the steps of:

forming the first pattern on a first surface and forming the second pattern on a second surface;

forming a first picture of at least a portion of the second pattern;

projecting an image of the first pattern onto the second surface;

forming a composite picture comprising at least a portion of the second pattern and at least a portion of the image of the first pattern projected thereon;

digitizing the first picture to generate a first digitized image, and digitizing the composite picture to generate a composite digitized image;

subtracting the first digitized image from the composite digitized image to generate a second digitized image, the second digitized image comprising at least a portion of the first pattern; and comparing the first digitized image and the second digitized image to calculate the alignment between the first pattern and the second pattern.

2. The method as claimed in claim 1, further comprising the step of forming the first pattern and the second pattern as repetitive patterns having periods substantially equal to each other.

3. The method as claimed in claim 1, wherein the step of comparing the first digitized image and the second digitized image further includes the steps of:

Fourier transforming the first digitized image and the second digitized image to generate a first spectrum and a second spectrum, respectively; and calculating a phase difference between the first spectrum and the second spectrum.

4. The method as claimed in claim 1, further comprising the step of forming the first pattern on a first surface of a wafer, and the second pattern on a second surface of a wafer.

5. The method as claimed in claim 4, wherein the step of forming the first pattern and the second pattern further includes the steps of:

forming the portion of the first pattern in an inactive chip area on the wafer; and forming the portion of the second pattern in the inactive chip area on the wafer and adjacent the portion of the first pattern.

6. The method as claimed in claim 5, wherein the step of generating a first digitized image and a second digitized image further includes the steps of:

forming an image of the portion of the first pattern and the portion of the second pattern in a camera; and digitizing a first portion of the image corresponding to the portion of the first pattern and a second portion of the image corresponding to the portion of the second pattern to generate the first digitized image and the second digitized image, respectively.

7. The method as claimed in claim 4, wherein the step of forming the first pattern and the second pattern further includes the steps of:

forming the portion of the first pattern in an inactive chip area on the wafer; and forming the portion of the second pattern in the inactive chip area on the wafer and superposed on the portion of the first pattern.

8. The method as claimed in claim 7, wherein the step of generating a first digitized image and a second digitized image further includes the steps of:

focusing a camera on the first surface to form a first image of the portion of the first pattern;

focusing the camera on the second surface to form a second image of the portion of the second pattern.

9. The method as claimed in claim 1 wherein the first surface is a wafer and the second surface is a mask.

10. An overlay measurement process, comprising the steps of:

forming a first array pattern on a first level;

forming a second array pattern on a second level;

forming a first picture of at least a portion of the second array pattern;

projecting an image of the first array pattern onto the second level;

forming a second picture of at least a portion of the second array pattern and at least a portion of the first array pattern projected thereon;

digitizing the first picture to generate a first digitized image;

digitizing the second picture to generate a second digitized image;

subtracting the first digitized image from the second digitized image to generate a third digitized image;

manipulating the third digitized image to generate a first geometric spectrum;

manipulating the first digitized image to generate a second geometric spectrum; and calculating a phase difference between the first geometric spectrum and the second geometric spectrum.

11. The process as claimed in claim 10, wherein the steps of forming a first array pattern and forming a second array pattern further include forming the first array pattern and the second array pattern on a wafer with the portion of the first array pattern and the portion of the second array pattern outside an active chip area on the wafer and adjacent to each other.

12. The process as claimed in claim 11, wherein the steps of generating a first geometric spectrum and generating a second geometric spectrum further include the steps of:

forming an image of the portion of the first array pattern and the portion of the second array pattern in a camera;

Fourier transforming a first portion of the image to generate the first geometric spectrum, the first portion of the image corresponding to the portion of the first array pattern; and Fourier transforming a second portion of the image to generate the second geometric spectrum, the second portion of the image corresponding to the portion of the second array pattern.

13. The process as claimed in claim 10, wherein the steps of forming a first array pattern and forming a second array pattern further include the steps of:

forming the first array pattern on a wafer; and forming the second array pattern on the wafer on top of the first array pattern with the portion of second array pattern superposed onto the portion of the first array pattern.

14. The process as claimed in claim 13, wherein the steps of generating a first geometric spectrum and generating a second geometric spectrum further include the steps of:

focus a camera on the first level to form a first image of the portion of the first array pattern;

focusing the camera on the second level to form a second image of the portion of the second array pattern;

Fourier transforming the first image to generate the first geometric spectrum; and Fourier transforming the second image to generate the second geometric spectrum.

15. The process as claimed in claim 10, wherein:

the step of forming a first array pattern includes forming the first array pattern on a wafer; and the step of forming a second array pattern includes forming the second array pattern on a mask.

* * * * *